US012808908B2

(12) United States Patent
Gnyedykh Temniy et al.

(10) Patent No.: US 12,808,908 B2
(45) Date of Patent: Nov. 24, 2026

(54) COMPUTER IMPLEMENTED METHOD FOR DEMAND DISAGGREGATION OF A POWER CONSUMPTION CURVE

(71) Applicant: SMARKIA ENERGY, S.L., León (ES)

(72) Inventors: Vasyl Gnyedykh Temniy, Madrid (ES); Ricardo Enríquez Miranda, Madrid (ES); Javier Juárez Montojo, Madrid (ES)

(73) Assignee: SMARKIA ENERGY, S.L., León (ES)

( * ) Notice: Subject to any disclaimer, the term of this patent is extended or adjusted under 35 U.S.C. 154(b) by 388 days.

(21) Appl. No.: 18/689,435

(22) PCT Filed: Sep. 6, 2022

(86) PCT No.: PCT/EP2022/074726
§ 371 (c)(1),
(2) Date: Mar. 6, 2024

(87) PCT Pub. No.: WO2023/036770
PCT Pub. Date: Mar. 16, 2023

(65) Prior Publication Data
US 2024/0410923 A1 Dec. 12, 2024

(30) Foreign Application Priority Data
Sep. 7, 2021 (EP) ..................................... 21382802

(51) Int. Cl.
*G01R 21/133* (2006.01)
*G06N 7/01* (2023.01)

(52) U.S. Cl.
CPC ........... *G01R 21/1336* (2013.01); *G06N 7/01* (2023.01)

(58) Field of Classification Search
CPC ...... G01R 21/1336; G06N 7/01; G06Q 10/04; G06Q 50/06
See application file for complete search history.

(56) References Cited

U.S. PATENT DOCUMENTS

| | | | | |
|---|---|---|---|---|
| 4,858,141 | A | 8/1989 | Hart et al. | |
| 9,705,327 | B2 * | 7/2017 | Rombouts .............. | G06Q 50/06 |
| 11,927,609 | B2 * | 3/2024 | Song .................. | G01R 19/2513 |

OTHER PUBLICATIONS

Gao Jingyue et al: "CAPED: Context-Aware Powerlet-Based Energy Disaggregation", Jun. 19, 2018 (Jun. 19, 2018), Advances in Biometrics : International Conference, ICB 2007, Seoul, Korea, Aug. 27-29, 2007; Proceedings; [Lecture Notes in Computer Science; Lect.Notes Computer], Springer, Berlin, Heidelberg, pp. 236-247.

(Continued)

*Primary Examiner* — Daryl C Pope
(74) *Attorney, Agent, or Firm* — S.J. INTELLECTUAL PROPERTY LTD.

(57) ABSTRACT

The present invention is related to a computer implemented method for demand disaggregation of a power consumption curve. The consumption curve, being the result of the use of a plurality of appliances operating in an overlapping manner where each of the appliances may be operating several times a day, start operating at different times and under different operating conditions. The present invention is a method that allows to extract very useful information from a single curve since it identifies which appliance is on at each instant of the day and allows to determine the consumption pattern of a user. The method, according to various embodiments, makes it possible to obtain the result with a reduced and affordable computational cost.

15 Claims, 5 Drawing Sheets

$h_{a,1}$ $h_{a,2}$ $,\ldots,$ $h_{a,n_a}$

(56) References Cited

OTHER PUBLICATIONS

Jordan Holweger et al: "Unsupervised algorithm for disaggregating low-sampling-rate electricity consumption of households", arxiv.org, Cornell University Library, 201 Olin Library Cornell University Ithaca, NY 14853, Aug. 20, 2019.

Sidhant Gupta et al: "ElectriSense", Proceedings of the 12th ACM International Conference on Ubiquitous Computing, UBICOMP '10, ACM Press, New York, New York, USA, Sep. 26, 2010 (Sep. 26, 2010), pp. 139-148.

* cited by examiner (a)

(b)

(c)

COMPUTER IMPLEMENTED METHOD FOR DEMAND DISAGGREGATION OF A POWER CONSUMPTION CURVE

FIELD OF THE INVENTION

The present invention is related to a computer implemented method for demand disaggregation of a power consumption curve. The consumption curve, being the result of the use of a plurality of appliances operating in an overlapping manner where each of the appliances may be operating several times a day, start operating at different times and under different operating conditions.

The present invention is a method that allows to extract very useful information from a single curve since it identifies which appliance is on at each instant of the day and allows to determine the consumption pattern of a user. The method, according to various embodiments, makes it possible to obtain the result with a reduced and affordable computational cost.

Prior Art

One of the technical fields with a more intensive development is the field of energy management.

Currently, pressure from governments to reduce greenhouse gas emissions is causing an increase in electricity consumption and a change in the consumption patterns of users. In particular, the increasing use of electric devices and electric vehicles requires management strategies that favor distributed consumption along the day/night and tools that allow users to improve their consumption patterns.

Nowadays, consumption measurement devices are available that not only provide the total consumption in a period of time but also provide consumption curves that show the evolution of consumption throughout the day.

Given a set of household appliances whose footprint or consumption signature is known, and knowing the time instants in which they are turned on during the day, it is immediate to determine the user's consumption curve.

On the other hand, the reverse problem is not at all obvious. There is no knowledge of the appliances that a user has, at what time he is going to start them up and, the combination of several appliances or devices running at the same time makes the consumption of one mask the consumption characteristics of others operating simultaneously.

In some situations it is possible to have some information about the devices that a user has, however, the same device may be operating in different ways and show a different consumption pattern and look like two different devices. Just considering a washing machine that operates with two different washing programs depending on the soiling of the clothes to be washed.

Some methods based on artificial intelligence techniques are currently known. For example, neural networks are deployed and trained with many practical cases in which information is available for each appliance or apparatus, not only its consumption pattern or signature but also the instant in which it is turned on. Once trained, they are instantiated to identify these consumption patterns and the instants at which each identified appliance is turned on.

However, these methods, although effective in many cases, do not allow intervention with various parameters that are known after deploying the neural networks, as they would require a new phase of user-specific training to condition the behavior of the neural network with this knowledge. This is the case when the user incorporates personal information through applications that can be used in this task of disaggregating the consumption curve.

Another problem with neural networks and other artificial intelligence techniques is that once trained, the knowledge of the weights established in the set of layers does not provide information about the user since control of how the neural network explains the disaggregation it has made of the consumption curve is lost.

The present invention solves the previously identified problems by means of an optimization method that makes use of clearly identifiable variables and that allows searching in a reduced search space that allows drastically reducing both computational cost and memory resources.

DESCRIPTION OF THE INVENTION

The present invention is a computer implemented method for demand disaggregation of a power consumption curve. The method comprises at least the following steps:

- obtaining a power consumption curve E(t) for a predetermined period of time T, wherein the period of time T is discretized giving rise to a discrete power consumption curve $E_m(t)$ in a predetermined m subintervals;
- determine a set of appliances that are susceptible to cause consumption power;
- for each appliance, obtaining a signature of its consumption $(h_{a,1}, h_{a,2}, \ldots, h_{a,n_a})$, a vector of $n_a$ coordinates with $n_a \leq m$, being $h_{a,i}$ the power consumption of the appliance at time subinterval i, being the power consumption of the appliance measured from the moment the appliance is switched-on during subintervals 1 to $n_a$, being $n_a$ the last subinterval in that the appliance is working.

The main source of information is the reading of the power consumption curve E(t) of the user. The user might have a plurality of appliances or apparatus contributing to the consumption curve along the day (several appliances might be switched on at the same time).

These measurements can be acquired, for example, through consumption measurement instruments which, in addition to carrying out this function, are responsible for sampling the consumption value over time. According to this example, these measuring instruments are connected to a central station to which they transfer the data read for subsequent analysis.

The method performs a discretization of the power consumption curve E(t) over a period of time T, resulting $E_m(t)$. This time period can be, for example, a full day or a full week. The longer the time to be discretized, the higher the resulting computational cost.

The period of time T is discretized in a predetermined m subintervals wherein the values of the power consumption curve $E_m(t)$ at each subinterval is a discrete value sampling the curve E(t). However, the discretization of the power consumption curve E(t) in m subintervals is independent of the fact that the curve obtained through the measuring equipment is also represented in a discrete form by means of a given sampling frequency. Usually the sampling frequency of the measuring devices will be higher than the sampling defined by the m subintervals used by the method.

According to a preferred example, the period of time T is 24 hours and it is discretized in m=24 subintervals.

The method also determine a set of appliances that are susceptible to cause consumption power and, obtain a signature of the consumption for each appliance.

The consumption signature for each appliance can be obtained experimentally by running the appliance over a period of time of normal operation and reading the individual consumption of that appliance without the reading being contaminated by the existence of other consumptions.

The consumption signature for a specific appliance is to be represented by a vector $(h_{a,1}, h_{a,2}, \ldots, h_{a,n_a})$ of $n_a$ coordinates. The value at each coordinate is denoted as $h_{a,i}$, the power consumption of the appliance at time subinterval i measured since the appliance is switched on during subintervals 1 to $n_a$. The $h_{a,i}$ values satisfy the condition $h_{a,i} \geq 0$ for all i.

Throughout the description, the term vector is used as an ordered collection of elements of the same type that are ordered and can be identified through an index. In the examples described the vector representing the power consumption curve $E_m(t)$ is a vector of $R^m$ with m the number of subintervals. The elements identified with some specific index will be identified as coordinate.

However, the implementation of the method can use equivalent storage modes such as ordered lists. As long as the operations are the same and, in a specific implementation, a collection of sorted data is operated on just as the vector is operated on, the method is considered to be equivalent.

This vector is not time referenced. The first subinterval measures consumption from the time the appliance starts up and the last sub-interval measures consumption before the appliance stops operating. The signatures of different appliances may have different lengths since they may be running for a different characteristic period of time. Similarly, the same appliance operating in different ways may have several signatures associated with it. This is the case of a washing machine that has several programs that make it operate with a different consumption pattern.

More formally, for each appliance (a) the set of its signatures may be expressed as:

$$\mathcal{F}_a = \{f_a = ((h_{a,1}, \ldots, h_{a,n_a}), \mu_a) \in \mathbb{R}^{n_a} \times \mathbb{R}\}_{n_a \in [1\theta, \ldots, T_a]}$$

wherein $T_a$ is the time interval measured as the number of intervals m corresponding to the sampling of interval T that the appliance (a) is operating and, each signature is defined by the $h_{a,i}$ $i=1, \ldots, n_a$ values plus the value of energy $\mu_a$ consumed out of the interval $[1, \ldots, T_a]$, $T_a \leq m$. This is the case for instance when the appliance is in standby where there is a remaining power consumption.

This mathematical expression does not prevent the implementation of the method in a computer program vectors using indexes starting at 0 as is the case for example in C or C++. In this case the signature would still be expressible through the mathematical formula shown above and therefore a specific embodiment of implementation.

The method further comprises the step:

for each appliance generating a set of powerlets of the form $$w=(\mu_a, \ldots, \mu_a, {}^{k0)}h_{a,1}, h_{a,2}, \ldots, h_{a,n_a}, \mu_a, \ldots, \mu_a)$$

being a powerlet a vector comprising at each coordinate values of power consumption in a plurality of subintervals for the period of time T; the powerlet comprising the values of a signature of the appliance located from a certain coordinate $k_0$ of the powerlet within the time period T and with a value of energy $\mu_a$ consumed in the remaining coordinates, and wherein each powerlet is generated for a signature located at a different position within said powerlet.

More formally this step may be expressed as: Let $f_a$ be signature profile of an appliance (a), then the set of all possible allocations/injections of this signature in $R^m$ represents a set of the powerlets of said appliance.

A powerlet is also a vector $w \in R^m$ comprising at each coordinate values of power consumption in a plurality of subintervals for the period of time T. That is, this vector is intended to store in the computer system where the method is implemented a discrete function representing the consumption of a single appliance operating at certain conditions switched on at a determined instant of time identified by index $k_0$ located within one of the m subintervals.

The powerlet has a predetermined $\mu_a$ value corresponding to the power consumption when the device is switched off, being at the standby mode, at each coordinate of time corresponding to a subinterval except those coordinates where the device is switched on wherein the set of m subintervals where the appliance of apparatus is switched on the powerlet has the values of the signature of the appliance. The $\mu_a$ according to an example is cero because it is more computationally convenient to treat the standby of the whole set of appliances all together.

If the time resolution of the signature and the powerlet are not the same, then the resolution is adapted. According to an example where the resolution of the firm is higher that the resolution of the powerlet, the power consumption of the powerlet at each subinterval showing power consumption is calculated as the summation of the values of the signature falling within the subinterval of the powerlet. Other alternative examples will be disclosed when disclosing a detailed example of the invention.

The method further comprises the step:

determining a combination of powerlets among the whole set of generated powerlets w fulfilling that $$E_m(t) - \sum_{i=1}^{n} w_i$$

is positive and is minimum, being n the number of selected powerlets $w_i$ of said combination;

outputting at least one identification of the appliance/appliances associated to the combination of powerlets determined in the previous step and the power consumption of said appliance in the period of time T.

The last steps determine an specific combination of powerlets fulfilling the condition of being the combination wherein the power consumption resulting from the summation of the powerlets is the closest to the real power consumption, this combination being such that the power consumption is not grater that the real one. The result of the expression $$E_m(t) - \sum_{i=1}^{n} w_i$$

will be identified along the description as objective function since this expression is formed by a residue to be minimized.

Once the set of powerlets that make the objective function minimal has been identified, the method allows to provide the information derived from each of the powerlets. At least, which appliances are associated with each powerlet and therefore are appliances that are considered to have caused part of the consumption shown by the consumption curve $E_m(t)$, and for each of these appliances, their powerlets (there may be more than one associated with the same appliance), will show the consumption over time T. If there is more than one powerlet, it is possible to sum these powerlets to have the consumption of the same appliance over time T without being differentiated for each time it has been switched on (which shows each of the powerlets).

The search for a combination that meets the minimum condition can be done by means of algorithms already implemented for this purpose.

According to an embodiment, the selected powerlets generated for the same appliance are restricted to those fulfilling that are orthogonal.

According to exemplary embodiments of the invention, the most efficient ways of reducing the computational cost consists in reducing the number of powerlet combinations that must be treated at the time of minimizing the expression of the objective function whose expression is $$E_m(t) - \sum_{i=1}^{n} w_i.$$

In this embodiment, the selected powerlets generated must be orthogonal wherein the standard pointwise scalar product will be used. Two powerlets are orthogonal if the standard pointwise scalar product of said two powerlets is zero (in the standard notation of a powerlet defined previously, this definition is only applied to the case where $\mu_a=0$ where $f_a=(h_{a,1}, \ldots, h_{a,n_a}), \mu_a)$).

Thus, for the case where $\mu_a=0$, the orthogonality condition between two powerlets requires that where the coordinate of one powerlet contains a non-zero value, the other powerlet must have a null value. This condition is equivalent to considering that the signatures of the same appliance or appliance used to generate two different powerlets must not operate in an overlapping manner at the same instant of time.

This same condition can be generalized when the coordinates of one or more powerlets contain $\mu_a>0$ values when there is no consumption of the appliance. In this case the coordinates with $\mu_a$ value will be considered null for the purpose of the scalar product calculation.

That is, let $w_a=(\mu_a, \ldots, \mu_a,^{k_0)} h_{a,1}, h_{a,2}, \ldots, h_{a,n_a}, \mu_a, \ldots, \mu_a)$ be a powerlet of the signature $f_a=(h_{a,1}, \ldots, h_{a,n_a}), \mu_a)$ and let $w_b=(\mu_b, \ldots, \mu_b,^{k'_0)} h_{b,1}, h_{b,2}, \ldots, h_{b,n_b}, \mu_b, \ldots, \mu_b)$ be a powerlet of the signature $f_b=((h_{b,1}, \ldots, h_{b,n_b}), \mu_b)$. Then the powerlets $w_a$ and $w_b$ are orthogonal if the scalar product of $(0, \ldots, 0,^{k_0)} h_{a,1}, h_{a,2}, \ldots, h_{a,n_a}, 0, \ldots, 0)$ and $(0, \ldots, 0,^{k'_0)} h_{b,1}, h_{b,2}, \ldots, h_{b,n_b}, 0, \ldots, 0)$ is equal to 0. It should be noted that $k_0$ and $k'_0$ do not necessarily have to coincide.

According to an embodiment, the selected powerlets are restricted to those wherein the number of powerlets corresponding to a predetermined appliance is less than a predetermined frequency number.

Reducing the number of powerlets in the generation process reduces not only the computational cost drastically by reducing the number of combinations to be checked until the combination that makes the objective function minimum is found, but also reduces storage resources by avoiding the generation of data structures to store powerlets.

According to this example, the number of powerlets generated is reduced because the same device is not allowed to operate more than a predetermined number of times, this number of times identified as frequency number.

According to another embodiment, a powerlet $w_i$ is discarded among the selected powerlets if $E_m(t)<w_i$ at any of its coordinates.

According to this embodiment, none of the powerlets are allowed to show a value higher that the power consumption curve at any time since said powerlet would not correspond to any appliance used for causing the power consumption curve.

According to another embodiment, when generating the set of powerlets, the method further comprises the following steps:

- determining a probability density function of the appliance which establishes the probability that the appliance is switched on;
- determining a probability threshold value;
- determine those time subintervals in which the probability of the appliance being switched on is greater than the probability threshold value;
- generating a powerlet for each subinterval fulfilling the previous condition, wherein the signature of the powerlet is located at said subinterval.

A further method for reducing the computational cost and the storage requirements is based on reducing the total number of powerlets.

According to this embodiment, a probability density function of an appliance is used when generating a powerlet with a signature associated to said powerlet. The probability density function corresponds to the probability that the appliance is switched on wherein those instants of time where the probability density function is lower than a threshold value then it is deemed that the appliance is not switched on at that time. Only those subintervals of the powerlet where the probability density function is higher than the threshold value are candidates for being the interval where the signature is located (where the first subinterval of the signature is located in the powerlet). The signature will provide its values at the coordinate fulfilling that the probability density value is higher than the threshold value and the next coordinates filling $n_a$ coordinates with the values of the signature.

According to a preferred embodiment, the probability density function of each class of appliance is calculated empirically from data coming from sensors; for example, from measurements of sensors of a sample of users. These probability density functions comes from prior distributions, which can also be combined with or substituted by some theoretical distributions. Then, these distributions are adjusted with the information of the feasibility of the presence of this class of powerlets along the consumption curve of each user. This is performed in the manner that, for example, given some moment to of the grouped energy curve of a user, and it is impossible to place any powerlet of an appliance class (a) at said moment $t_0$ because $E_m(t_0)<w_i$. Then, the probability of this appliance to start at this moment to is equal to zero. Next, a posterior distribution of the appliance usage is obtained for each particular user. The adjustment of these probability distribution functions might be done by different methods; for example, by:

1. Conserving the initial prior, changing the probability to 0 for the moments of the impossibility of the consumption, renormalizing the distribution.

2. Conserving the initial prior, changing the probability to 0 for the moments of the impossibility of the consumption, without any renormalization (giving rise to a pseudo probability conceptualization).

3. Sampling from the prior distribution and from the Sample distribution (distribution in which the frequencies are defined from the disposability of a number of powerlets for each moment t), combining these two samples in one with defined proportion. The combination may be carried out by sampling a first distribution and further sampling a second distribution and then, joining the two samples.

Next coordinate may also fulfill the same condition and then a new powerlet would be generated unless previous conditions such as the frequency number or the orthogonality condition limit the number of powerlets to be generated.

According to another embodiment, for determining the combination of powerlets, the method further comprises the following steps:

- determining a probability density function of the appliance which establishes the probability that the appliance is switched on;
- determining a probability threshold value;
- determine those time subintervals in which the probability of the appliance being switched on is greater than the probability threshold value;
- selecting a powerlet for each subinterval fulfilling the previous condition, wherein the signature of the powerlet is located at the subinterval.

In this embodiment the powerlets are already generated but, when selecting the powerlets to be combined in order to get into the step of the optimization process then only a selection of powerlets is taken, those fulfilling that the signature is located at a coordinate of the powerlet wherein the probability density function is higher than the predetermined threshold value.

Even if the powerlet has already been generated consuming storage means, the selection process discard those not fulfilling the condition reducing the computational cost since the total number of combinations are highly reduced.

According to another embodiment, the probability density function is determined by:

- determining a set of time instants in the time interval T wherein the appliance is switched on;
- determining a normal distribution for each time instant with the mean value at the time instant and with a predetermined variance;
- providing the probability function as the mixture of Gaussian distributions being normalized.

According to an example of this embodiment, the user may provide additional information about his habits or, this information can be obtained after having applied the method of the invention in previous periods of time through which certain behavioral patterns are determined. These behavioral patterns translate into certain times of the day when an appliance is more likely to be switched on.

With these time instants, probability density functions are generated, for example following a normal distribution, in which the mean is located at each of the time instants where there is a probability that the user will make use of the appliance and, with a pre-established variance depending on how precise the information is.

The sum of all the probability density functions, once normalized, is a new probability density function. The function that establishes which powerlets are generated or selected according to the method described above.

According to another embodiment, the probability density function depends on contextual parameters:

- the period between consecutive uses of an appliance (a); or
- the period between the use of an appliance (a) and the use of other appliance (b); or
- the day of the week; or
- the month of the year; or
- the festive days; or
- the holidays; or
- the temperature; or
- the zip code of the house; or
- a combination of any one of the previous.

In any of the identified cases the probability density shows a dependency on the parameter. For example, if the probability density function depends on the day of the week and the period T covers the 24 hours of a day, the probability density function used will depend on the day on which the power consumption curve E(t) function has been recorded.

If the dependence is with respect to the zip code then the probability density function will be associated with behavioral patterns associated with the zone corresponding to that zip code.

In another embodiment, the probability density depends on a user consumption patterns.

An example corresponding to this embodiment establishes the user's behavior by analyzing the consumption habits shown by the user in previous periods. Another example may be based on information that the user provides for example through an application in which the user must fill in a form.

The probability density function will show peaks in its value at those instants of time when consumption of the appliance for which the powerlet is being constructed is usually known to occur.

According to another embodiment, the probability density function depends on statistics of user consumption behaviors.

There are many occasions in which direct information on personalized behavior patterns is not available, but statistics on the habits of groups of users are available. If the user is within one of these groups, the information on behavioral patterns allows to establish which appliances the user switch on and at what times. This information is used to define the probability density function.

According to another embodiment, the signature of an appliance is measured with sensors.

The use of sensors to measure the consumption of a household appliance allows the measured values not to be influenced by the accumulated consumption of other devices or appliances. Measurement under such controlled conditions ensures that the consumption signature of the appliance is very reliable. From the measured data it is possible to build a database with the signatures of the models that have undergone experimentation, with as many signatures as operating conditions the appliance can perform. This is the case, for example, of a dishwasher with a given set of wash programs and where each wash program shows a different consumption signature, including its duration.

According to another embodiment, the signature of an appliance is obtained from statistics.

According to an embodiment, the signature of an appliance is obtained from statistic data whose origin is either from the measurements coming from the sensors installed in some sample set of households or from the technical characteristics of each appliance. Having recollected these samples, a series of (user defined) time-shifts are applied to each empiric signature, aggregating them all according to the chosen time aggregation (according to the preferred embodiment an hourly one) into a set of time aggregated vectors. Then the optimized clustering is applied to this set of vectors, obtaining the set of the representative signatures (centroids) which then are stored in a database in order to be used as the set of units in the process of the desegregation.

One of the most relevant problems of obtaining a signature using sensors is that it is necessary to have access to the appliance to be characterized through its signature. In order to have a sufficiently complete database, it would be necessary to acquire or have access to each of the appliances to be characterized. One possibility is that each manufacturer would provide this data, however, the reality is very different and there may be old appliances that are not even on the market anymore.

According to this example of realization, it is not necessary to have the appliance and the characterization by means of the signature acquired through statistical data of consumption of an appliance according to its function. That is, a washing machine is expected to have certain elements in the washing process that are common to all washing machines and thus establish a common signature.

According to another embodiment, the signatures of the appliances are stored in a database.

Having a set of signatures for each type of appliance allows one type of appliance to have several signatures associated with it and each of them can be obtained in a different way. There may even be very specific signatures in which the signature is associated with a specific model of appliance and operating under a pre-established operating program and, generic signatures for that type of device usable when the database does not have the specific signature.

Under these conditions the result is a very robust method in which there would always be at least one signature with which to generate powerlets.

According to another embodiment, the step of determining the combination of powerlets among the whole set of generated powerlets w fulfilling that $$E_m(t) - \sum_{i=1}^{n} w_i$$

is positive and is minimum and is performed gradually, so that the method minimizes at least a first power consumption curve $E_1(t)$ and subsequently a remaining power consumption curve $E_2(t)$:

$$E_1 = E_m(t) - \sum_{i=1}^{j} w_{a_i}$$
$$E_2 = E_1 - \sum_{i=j+1}^{n} w_{b_i}$$

and wherein;

1<j<n;

$w_a$ are the powerlets associated to a predetermined first set of appliances (a);

$w_b$ are the powerlets associated to the set of remaining appliances (a) resulting from discarding the first set of appliances (a);

and the second index in $w_{ai}$ and $w_{bi}$ is the time index.

According to an embodiment, the first set of appliances (a) corresponds to those with continuous consumption patterns.

According to an embodiment, the set of remaining appliances (a) corresponds to those with energetic and eventual consumption patterns.

According to an embodiment, this method applied gradually is iteratively applied wherein the set of remaining appliances (a) is split again in a first set of appliances (a) and a set of remaining appliances (a) resulting from discarding the new first set of appliances (a).

The greatest impact on the power consumption curve is made by appliances responsible for one-time consumption with very distinctive signatures with a relevant energy impact. The rest of the appliances may be devices that are constantly running or with irregular patterns.

The method establishes a set of sub-steps in the minimization procedure where the combination of powerlets is determined sequentially.

First, a search for powerlets corresponding to appliances with a signature or pattern that shows a certain energy value and/or is eventual is carried out. This makes it more easily distinguishable from other patterns.

With this step, having reserved powerlets in the selection of the final combination that minimizes the objective function means that these powerlets are no longer taken into account in the search for other combinations and any other classified as a powerlet having a distinctive signature with a relevant energy impact.

The next stage only combines a second group of powerlets, those with continuous consumption. After this selection, there is a set of powerlets that no longer belong to the search space, all those that are associated to appliances with a signature that shows an important and eventual energy value and also the powerlets that have a continuous signature. Excluded are not only powerlets that have been selected in the intermediate minimization process but any of the other powerlets with a signature that shows a significant and eventual energy value and also powerlets that have a continuous signature.

In this way, the last step only requires working on a significantly smaller search space, the one formed by the powerlets that have an irregular pattern with low energy impact.

In each sub-step, once the objective function is minimized with a selected subset of powerlets, it is subtracted from the consumption curve so that it is the remaining power consumption curve that is used in the next optimization step.

According to an specific embodiment:

- appliances with powerlets $w_{ai}$ comprise a refrigerator and standby; and
- appliances with powerlets $w_{bi}$ comprise at least one of a dishwasher, a cloth dryer, a washing machine, an oven, a kitchen robot, a ceramic hob, a water heater, an electric space heater or an air-conditioning; and
- further appliances with powerlets $w_c$ comprise at least one of a microwave, a television, an iron, a coffee maker, a kettle, a toaster, a stove, a lighting device, a vacuum, a hair appliance, video game console or a computer.

A second aspect of the invention is a computer program product comprising instructions which, when the program is executed by a computer, cause the computer to carry out a method according to the steps of any of the preceding embodiments and examples.

DESCRIPTION OF THE DRAWINGS

These and other features and advantages of the invention will be seen more clearly from the following detailed description of a preferred embodiment provided only by way of illustrative and non-limiting example in reference to the attached drawings.

DETAILED DESCRIPTION OF THE INVENTION

As will be appreciated by one skilled in the art, aspects of the present invention may be embodied as a system, method or computer program product. According to a first aspect of the invention, an example of disaggregation of the power consumption curve of a given user is described resulting in: the identification of a set of appliances responsible for the consumption that has given rise to the power consumption curve, the instant at which each of the appliances have been switched on and, the consumption signature for each of said appliances.

In this way, the inverse problem of determining which devices have contributed with their individual consumption to the power consumption curve is posed, starting from the reading of the power curve of a given user without having physical access to the devices at his disposal and without having precise information of the moments in which the user switch on each of the devices and which ones.

Figure 1:
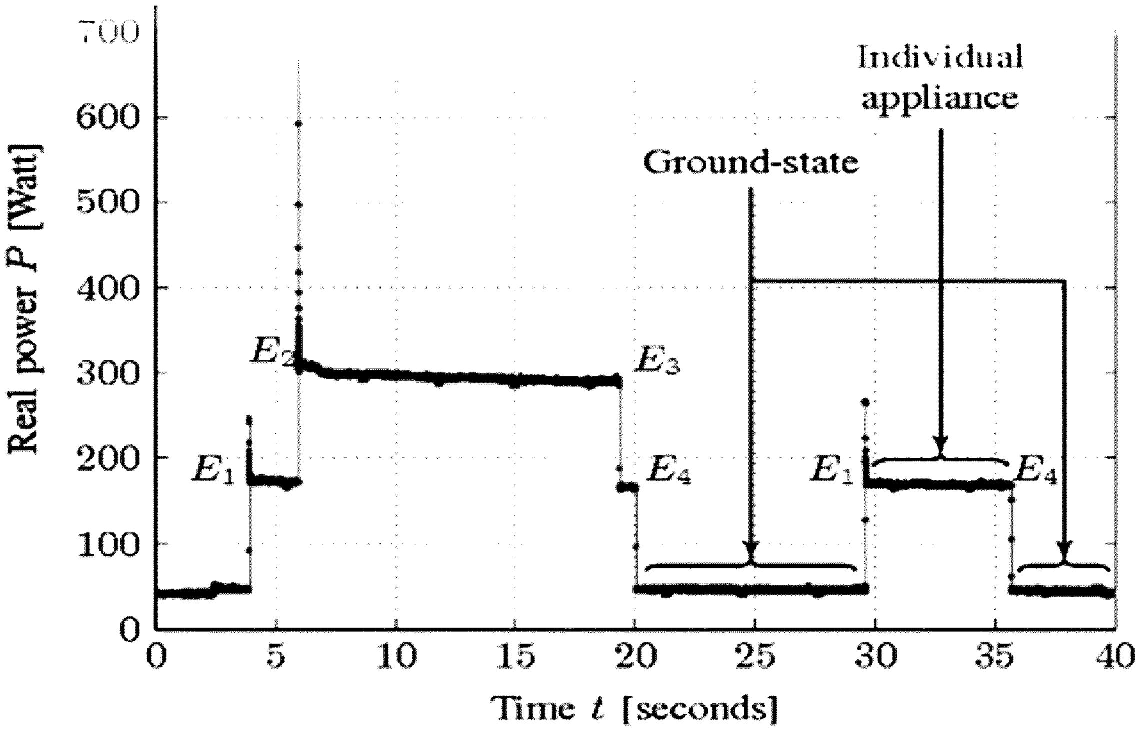
FIG. 1 This figure shows the power consumption curve of a real case wherein $E_1$, $E_2$, $E_3$ and $E_4$ are individual appliances causing abrupt changes in the function.

FIG. 1 shows a power consumption curve showing abrupt changes due to switching on or off of different appliances. The same curve may be located higher or lower, for example, depending on whether there are simultaneously devices that have a continuous consumption. This is the case of devices that instead of being switched off completely go into a standby state.

The curve depicted in FIG. 1 is usually recorded because the measurement equipment samples the power consumption signal or variable with a sampling rate sufficient to show significant changes even within a one-minute interval. This function with a high resolution can be transformed into a function with a lower resolution, with a coarse discretization, for example by imposing that the area of the second low resolution curve maintains the area of the first high resolution curve and therefore represents the same overall consumption.

The second input data used by the method is a set of power consumption signatures for a plurality of appliances. Although the word appliance is used, it is understood that this is any device connected to the network that is monitored to give rise to the power consumption curve. That is, an electric vehicle plugged in to charge the battery is also an appliance in the context of the invention.

The function depicted in FIG. 1 is usually acquired because the measurement equipment samples the power consumption variable with a sampling rate sufficient to show significant changes even within a one-minute interval. This function with a high resolution can be transformed into a function with a lower resolution, for example by requiring that the area of the second best resolution curve maintains the area and therefore represents the same overall consumption.

The second input data used by the method is a set of power consumption signatures for a plurality of appliances. Although the word appliance is used, it is understood that this is any device connected to the network that is monitored to give rise to the power consumption curve. That is, an electric vehicle plugged in to charge the battery is also an appliance in the context of the invention.

A consumption signature is to be defined as a vector in which, for each coordinate, contains the value of the power consumption of the device in a set time interval. For example, if the signature sets a sampling period every 15 minutes and the appliance remains on for three and a half hours from the time it is switched on then the vector representing the signature will have dimension 14 which is the result of dividing the time it remains on (3.5 h) and the duration of the interval (15 min=0.25 h). In this case each coordinate has the value of the power consumption of the device along the 15 min corresponding to said coordinate.

Figure 2:
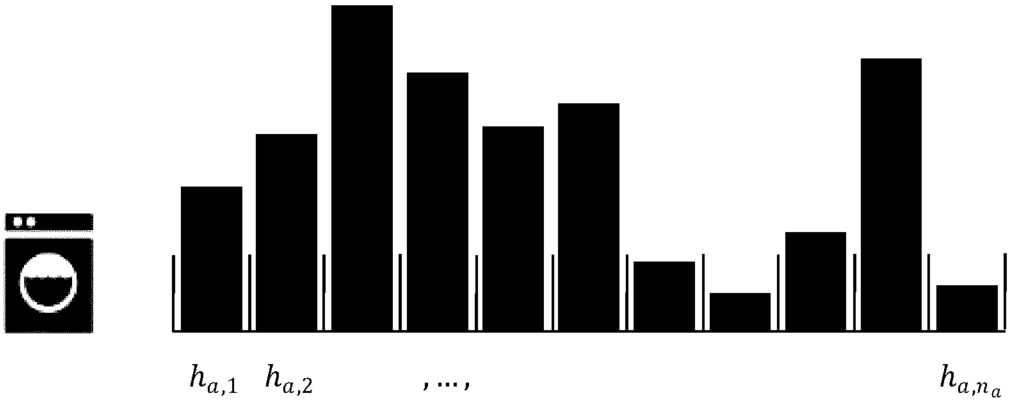
FIG. 2 This figure shows schematically the content of a signature stored in a vector for an specific appliance.

FIG. 2 shows a schematic representation of the signature of an appliance according to an operational mode. That is, the same appliance can run for three hours if it operates in a certain operating mode (e.g. a washing machine operating in a certain washing program) or two hours in a different program (the same washing machine operating in a less demanding program). In addition to having a different duration, the operating pattern is different. For example, the most demanding program can raise the washing temperature by activating the heating elements that have a high consumption and that this consumption is at the beginning, after having filled the water tank, turning off at the moment of having reached the operating temperature.

FIG. 2 shows schematically a consumption signature for a given household appliance, a washing machine as shown in the left side. The horizontal line corresponds to the time where each coordinate is represented by a certain width, the width of the time interval in which the accumulated power consumption is measured.

The value of each vertical bar has a height proportional to the consumption of the appliance in that interval. Although the vector is represented by a union of sub-intervals, it can be stored in a computational system as a vector of length $n_a$, where $n_a$ is the dimension of the vector, i.e. $(h_{a1}, h_{a2}, \ldots, h_{an})$.

The next stage of the method is the generation of powerlets from appliance signatures.

The powerlet is a vector, denoted as w throughout this description, showing the consumption of a given appliance when it has been operating with a consumption according to a given signature. This consumption could have been initiated at a certain instant of time. When the same appliance is started at different time instants then two different powerlets are generated. These different powerlets will show the consumption signature at different time intervals and without overlapping since the sum of one and the other powerlet would give rise to an incongruence since the same machine cannot be started when it has not yet finished operating.

The simplest way to generate powerlets is to use vectors whose coordinates represent the same time period as the signature coordinates. In this case the generation of a powerlet from a signature consists of an operation of assigning each of the coordinates of the signature to successive coordinates of the powerlet starting at the instant when the appliance is switched on.

Figure 3:
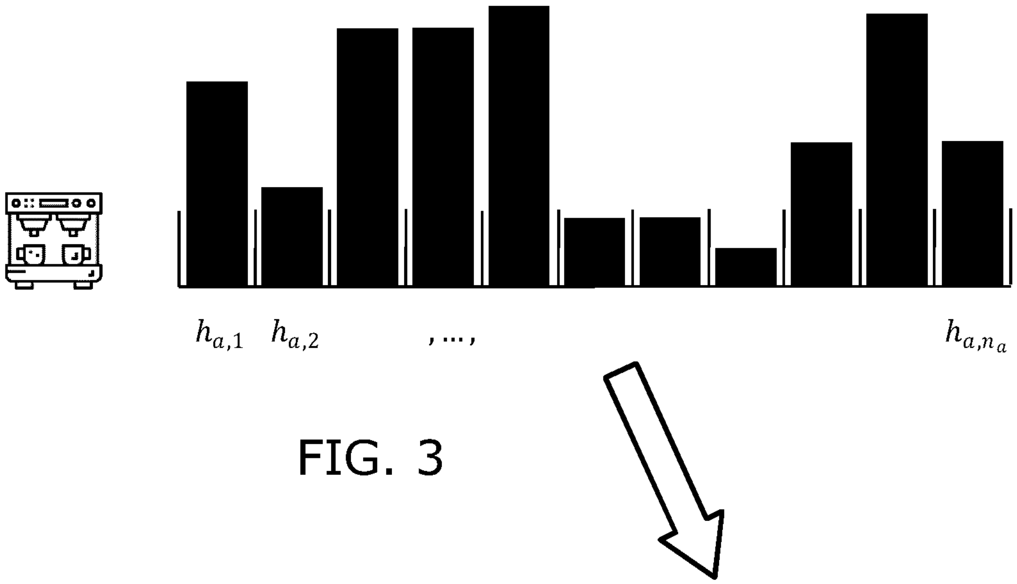
FIG. 3, 4 This figure shows schematically the content of a different signature used for generating two different powerlets. The two powerlets are shown in FIG. 4.
Figure 4:
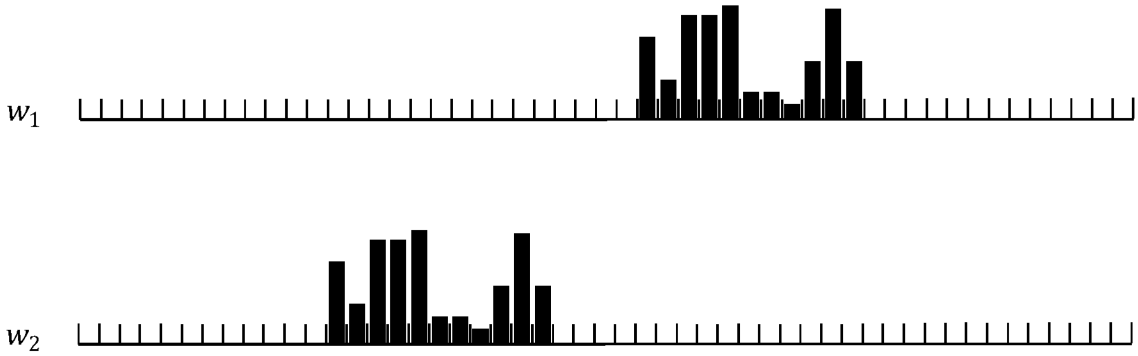

FIGS. 3 and 4 show this assignment operation. FIG. 3 shows schematically the power consumption signature vector of a given appliance, a coffee maker.

FIG. 4 shows two possible powerlets generated from the same power consumption signature.

A first powerlet generated with a time instant when the appliance is switched on near the end of the period T covered by the powerlet and a second powerlet where the appliance is switched on at an earlier time instant.

Figure 5:
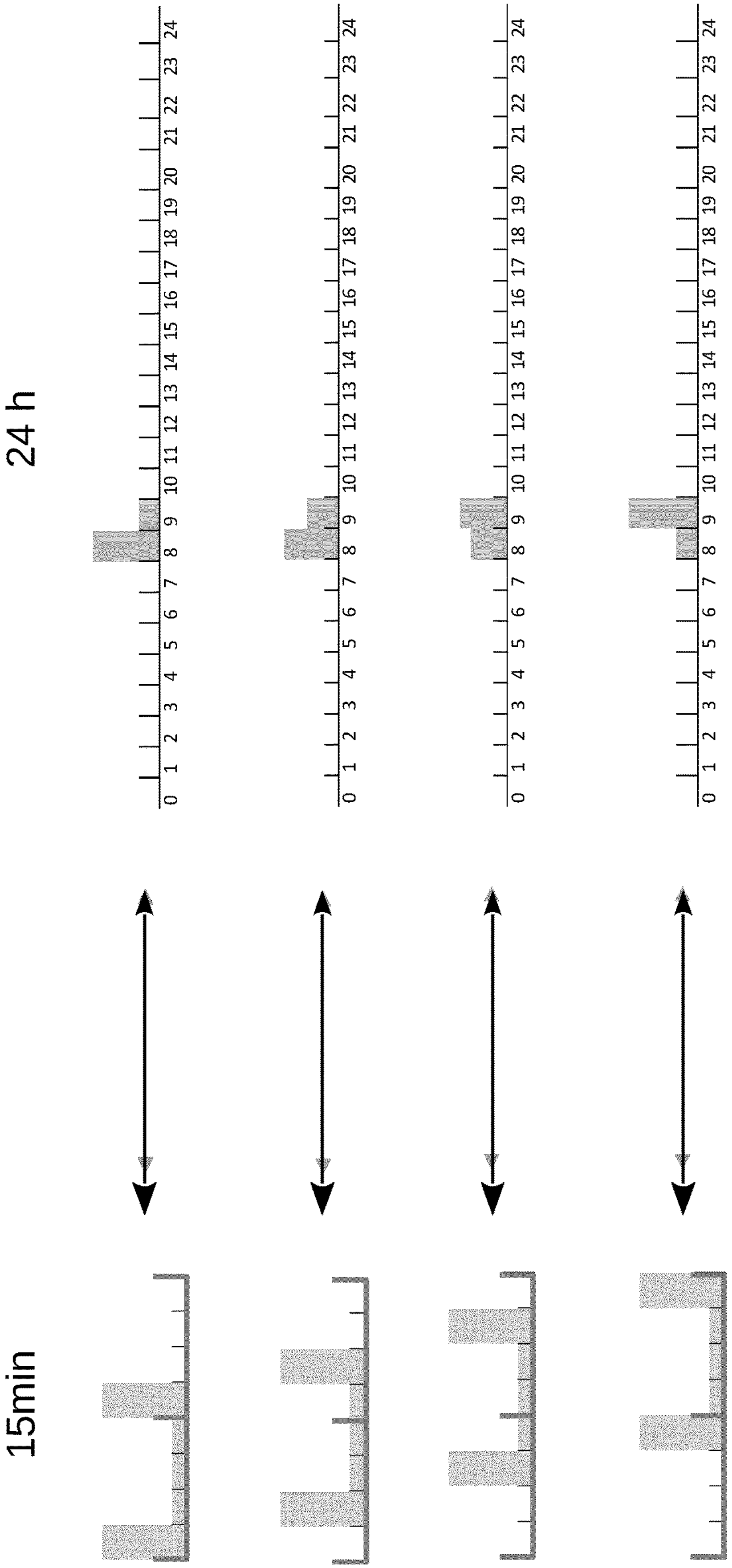
FIG. 5 This figure shows a specific example where a signature with a higher resolution is used for generating different firms already assigned to a powerlet, these signatures associated with different time instants of start-up of the appliance.

FIG. 5 shows an example of how to combine appliance signatures generated with a temporal resolution greater than the temporal resolution of the powerlet.

The left side of the figure shows the signature of an appliance with a temporal resolution of 15 minutes. In this example the time vector has been extended even if there are zero-valued coordinates to facilitate the understanding of the process by making use of vectors having the same length. Thus, it is easier to compare each of the vectors showing the same signature shifted at different time instants. That is, with the 15-minute resolution, the same appliance will show its behavior pattern shifted in time depending on when it starts to start up.

If the powerlet does not have the 15-minute resolution, it seems a priori that it is not possible under this lower resolution to distinguish at what time the appliance starts up.

However, it can be seen that a powerlet with a resolution of one hour will show the cumulative values shown on the right. The same signature with a resolution of 15 minutes shifted every 15 minutes results in 5 distinct 1-hour signatures. Thus, by using a larger number of signatures at lower resolution, it is possible to identify not only the signature of the appliance but also the instant of time at which it was started up with a higher resolution than that allowed by the powerlet.

The right side of the figure shows the four signatures with a resolution of 1 hour already assigned in the powerlet at the same initial time instant t=8. The signature will therefore be a vector of dimension two taking the values of the coordinates shown at t=8 and t=9.

The power consumption curve E(t) is the result of adding up the consumption of the actual appliances that have been activated at certain points in time.

The powerlets are vectors that serve as a basis to explain the consumption of the consumption curve E(t) in such a way that, in the ideal case, the powerlets correspond in a real way to the consumptions of each appliance both because the signature from which they have been generated is the signature of the appliance and because the location of the signature in the powerlet corresponds to the exact instant of time the appliance has been switched on.

However, in practice this ideal case does not happen, since the signature may be an approximation of the real signature, the resolution of the signature is low or, the instant of time used during the generation of the powerlet is not exactly the same.

Therefore, the minimization process will identify those powerlets among the set of generated powerlets that provides a better approximation of the measured power consumption curve.

For each signature, it would be possible to generate as many powerlets as coordinates are available in the powerlet for representing a different instant for switching on the appliance. However, the number of combinations would be so high that the result may require too much computational cost or even be unaffordable.

Figure 6:
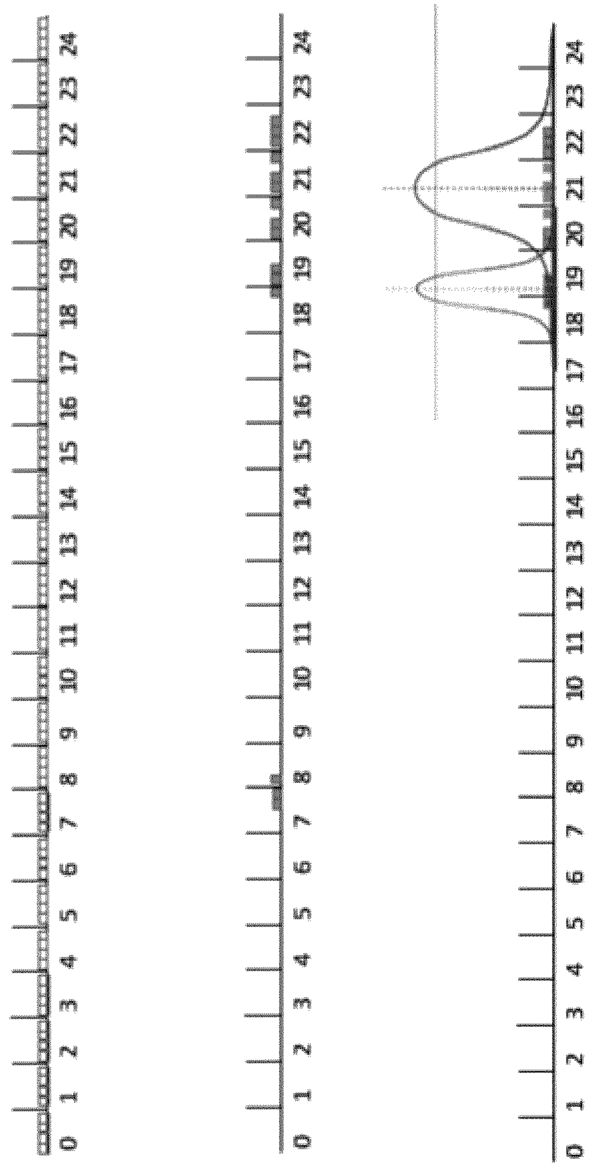
FIG. 6 This figure shows a process in which, starting from a very large set of powerlets generated for a set of signatures, criteria are progressively established that limit the powerlets selected to establish the search space to be used in the optimization process.

This situation is schematically represented in FIG. 6 (*a*) wherein a specific signature is shown at many locations of the coordinates of a powerlet filling all the gaps. The total number of powerlets generated with a single signature will be very high and all of them would be part of the search space in the minimization process making the process highly computationally intensive.

Therefore, according to several embodiments of the invention, the generation process of powerlets limits the number of generated powerlets to those that are most likely to be involved in a combination that minimizes the objective function. In this embodiment and any further embodiment, the restriction of reduction of powerlets may be applied during the generation process causing a reduction of the generated set of powerlets or, in a subsequent selection process.

Step (b) shows a first restriction based on feasibility. According to this criterion, only those powerlets that correspond to viable situations are maintained. For example, an orthogonality condition between two powerlets for the same appliance is equivalent to requiring that an appliance cannot be started until a previous process has been completed for the same appliance. This is a non-overlapping condition. It is possible to include additional conditions such as not combining an air conditioner and a heating appliance because it is highly unlikely that both will be switched on simultaneously with opposite functions.

This same figure shows a stage (c) in which a probability density function is first established so that only those powerlets that verify that they are located in time coordinates where the probability density function is higher than a certain threshold prevail.

Therefore, according to other examples of realization, although the number of powerlets is high, they reduce the computational cost in the process of selecting the powerlets to be combined by discarding powerlets even if they have been generated.

According to the example of step (c), it is shown how the number of powerlets to be generated is reduced is based on the use of probability density functions that represent the probability that at a given instant of time a given appliance will be switched on.

The information that allows determining which time instants are more likely that a certain appliance will be switched on can come from statistics obtained based on a user profile, from previous measurements or even because the user wanted to share information requested through a mobile application.

If, for example, for a given household appliance it is known that there are three-time instants in which it is likely to be switched on, the method makes use of three normal or Gaussian probability density functions whose mean is located at those time instants and, with a predetermined variance.

The sum of the probability density functions is a new function that, once normalized, becomes the probability density function associated with the appliance in question.

Figure 7:
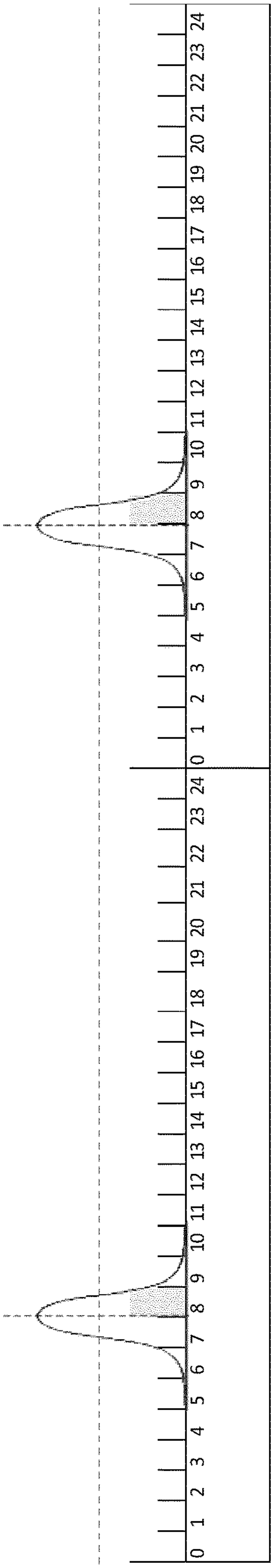
FIG. 7 This figure shows a specific embodiment wherein the generation of powerlets are limited to those wherein the start-up of the appliance is located on time coordinates wherein a probability density function is higher than a predetermined threshold.

As it is shown in FIG. 7, the method also requires a threshold value such that all those sub-intervals of time in which the probability density function is greater than this threshold are sub-intervals that will give rise to a new powerlet in which the start of the signature of the appliance is located. Likewise, all those intervals below the threshold value will be sub-intervals in which the start of the appliance signature is not located, thus reducing the number of powerlets generated per appliance.

The significant reduction in computational cost and memory consumption in the computational system responsible for executing the method lies in the fact that the number of powerlets generated is restricted to only those where the signature starts at powerlet coordinates where the probability density function exceeds the threshold value.

Raising the threshold value therefore reduces the total number of powerlets generated and, lowering the threshold value increases the number of powerlets as shown in FIG. 7 where the cut-off of the threshold value occurs at values closer to the base of each of the bells and therefore resulting in wider valid intervals for placing the signatures.

According to an embodiment, the probability density function is the one closest in time. A further embodiment extend the information to those available in the historical record where those probability density functions that are closer in time, or those that meet an additional criterion that makes the pattern of behavior closer, are more important. For example, that it is the same day of the week.

In either case, the result is a restricted search space that results in a much less computationally and memory costly minimization process.

The invention claimed is:

1. A computer implemented method for demand disaggregation of a power consumption curve E(t) of a user, the method comprising:

obtaining a measurement, from a measurement instrument, of the power consumption curve E(t) of the user, the user having a plurality of appliances contributing to the consumption measured by the measurement instrument, the measurement obtained for a predetermined period of time T, wherein the period of time T is discretized giving rise to a discrete power consumption curve $E_m(t)$ in m predetermined subintervals;

determining a set of appliances (a) that are susceptible to cause consumption power;

for each of the appliances, obtaining a signature (f) of its consumption $(h_{a,1}, h_{a,2}, \ldots, h_{a,n_a})$, a vector of $n_a$ coordinates with $n_a \le m$, being $h_{ai}$ the power consumption of the appliance (a) at time subinterval i, being the power consumption of the appliance (a) measured from the moment the appliance (a) is switched-on during subintervals 1 to $n_a$, being $n_a$ the last subinterval in that the appliance (a) is working;

for each of the appliances (a) generating a set of powerlets, w, of the form $$w=(\mu_a, \ldots, \mu_a, {}^{k_0)}h_{a,1}, h_{a,2}, \ldots, h_{a,n_a}, \mu_a, \ldots, \mu_a)$$

being a powerlet a vector comprising at each of the coordinates values of power consumption in a plurality of subintervals for the period of time T; the powerlet comprising the values of the signature (f) of the appliance (a) located from a certain coordinate $k_0$ of the powerlet within the time period T and with a value of energy $\mu_a$ consumed in the remaining coordinates, and wherein each powerlet is generated for the signature (f) located at a different position within said powerlet;

restricting the set of generated powerlets to a subset selected based on a probability that the corresponding appliance is switched on during the time subinterval at which the signature is located by determining a combination of powerlets among the restricted subset of powerlets fulfilling that $$E_m(t) - \sum_{i=1}^{n} w_i$$

is positive and is minimum, being n the number of selected powerlets $w_i$ of said combination;

outputting, based on the determined combination of powerlets, at least one identification of an appliance of the user determined to have been switched on during the predetermined period of time T and a power consumption attributable to the identified appliance during the predetermined period of time T.

2. The method according to claim 1 wherein the selected powerlets generated for the same appliance (a) are restricted to those fulfilling that are orthogonal.

3. The method according to claim 1, wherein the selected powerlets are restricted to those wherein the number of powerlets corresponding to a predetermined appliance (a) is less than a predetermined frequency number.

4. The method according to claim 1, wherein a powerlet $w_i$ is discarded among the selected powerlets if $E_m(t) < w_i$ at any of its coordinates.

5. The method according to claim 1, wherein, when generating the set of powerlets, the method further comprises the following steps:

determining a probability density function of the appliance (a) which establishes the probability that the appliance (a) is switched on;

determining a probability threshold value;

determining those time subintervals in which the probability of the appliance (a) being switched on is greater than the probability threshold value;

generating a powerlet (w) for each subinterval fulfilling the previous condition, wherein the signature (f) of the powerlet is located at said subinterval.

6. The method according to claim 1, wherein for determining the combination of powerlets, the method further comprises the following steps:

determining a probability density function of the appliance (a) which establishes the probability that the appliance (a) is switched on;

determining a probability threshold value;

determining those time subintervals in which the probability of the appliance (a) being switched on is greater than the probability threshold value;

selecting a powerlet (w) for each subinterval fulfilling the previous condition, wherein the signature (f) of the powerlet is located at the subinterval.

7. The method according to claim 5, wherein the probability density function is determined by:

determining a set of time instants in the time interval T wherein the appliance (a) is switched on;

determining a normal distribution for each time instant with the mean value at the time instant and with a predetermined variance;

providing the probability function as the mixture of Gaussian distributions being normalized.

8. The method according to claim 5, wherein the probability density function depends on contextual parameters:

the period between consecutive uses of an appliance (a); or the period between the use of an appliance (a) and the use of other appliance (b); or the day of the week; or the month of the year; or the festive days; or the holidays; or the temperature; or the zip code of the house; or a combination of any one of the previous.

9. The method according to claim 5, wherein the probability density depends on a user consumption patterns or the probability density function depends on statistics of user consumption behaviors.

10. The method according to claim 1, wherein the signature (f) of the appliance (a) is measured with sensors.

11. The method according to claim 1, wherein the signature (f) of the appliance (a) is obtained from statistics.

12. The method according to claim 1, wherein the signatures (f) of the appliances (a) are stored in a database.

13. The method according to claim 1, wherein the step of determining the combination of powerlets among the whole set of generated powerlets w fulfilling that $$E_m(t) - \sum_{i=1}^{n} w_i$$

is positive and is minimum and is performed gradually, so that the method minimizes at least a first power consumption curve $E_1$ and subsequently a remaining power consumption curve $E_{2(t)}$:

$$E_1 = E_m(t) - \sum_{i=1}^{j} w_{a_i}$$

-continued $$E_2 = E_1 - \sum_{i=j+1}^{n} w_{b_i}$$

and wherein;

$1<j<n$;

$w_a$ are the powerlets associated to a predetermined first set of appliances (a);

$w_p$ are the powerlets associated to the set of remaining appliances (a) resulting from discarding the first set of appliances (a);

and the second index i in $_{ai}$ and $w_{bi}$ is the time index.

14. The method according to claim 13, wherein:

appliances with powerlets $w_{ai}$ comprise a refrigerator and standby; and appliances with powerlets $w_{bi}$ comprise at least one of a dishwasher, a cloth dryer, a washing machine, an oven, a kitchen robot, a ceramic hob, a water heater, an electric space heater or an air-conditioning, and further appliances with powerlets $w_{ci}$ comprise at least one of a microwave, a television, an iron, a coffee maker, a kettle, a toaster, a stove, a lighting device, a vacuum, a hair appliance, video game console or a computer.

15. A non-transitory computer-readable storage medium storing instructions which, when executed by one or more processors, cause the one or more processors to perform the method of claim 1.

* * * * *